(12) United States Patent
Lee

(10) Patent No.: US 11,949,271 B2
(45) Date of Patent: Apr. 2, 2024

(54) LOAD SHARING CONTROL DEVICE

(71) Applicant: LG INNOTEK CO., LTD., Seoul (KR)

(72) Inventor: Jae Sam Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/916,606

(22) PCT Filed: Apr. 6, 2021

(86) PCT No.: PCT/KR2021/004278
§ 371 (c)(1),
(2) Date: Oct. 3, 2022

(87) PCT Pub. No.: WO2021/206416
PCT Pub. Date: Oct. 14, 2021

(65) Prior Publication Data
US 2023/0155406 A1 May 18, 2023

(30) Foreign Application Priority Data

Apr. 7, 2020 (KR) .......................... 10-2020-0042384

(51) Int. Cl.
*H02J 7/00* (2006.01)
*G01R 19/165* (2006.01)
(Continued)

(52) U.S. Cl.
CPC .... *H02J 7/00712* (2020.01); *G01R 19/16552* (2013.01); *H02M 1/0025* (2021.05); *H02M 3/155* (2013.01)

(58) Field of Classification Search
CPC .. H02J 7/00712; H02M 3/155; H02M 1/0025; G01R 19/16552
See application file for complete search history.

(56) References Cited

U.S. PATENT DOCUMENTS

| 11,644,880 B1* | 5/2023 | Thibodeau | .............. H02J 1/106 |
| | | | 713/300 |
| 2008/0197825 A1* | 8/2008 | Siri | .......... H02J 1/102 |
| | | | 323/272 |

(Continued)

FOREIGN PATENT DOCUMENTS

| CN | 104885321 A | 9/2015 |
| EP | 1 061 629 A1 | 12/2000 |
| JP | 2018-19447 A | 2/2018 |

*Primary Examiner* — Jared Fureman
*Assistant Examiner* — Esayas G Yeshaw
(74) *Attorney, Agent, or Firm* — Birch, Stewart, Kolasch & Birch, LLP

(57) ABSTRACT

An embodiment of the present invention provides a load sharing control device included in each of multiple power supply devices connected to a load in parallel, the load sharing control device comprising: a first control unit for generating a first control signal which controls an output current of a power supply device, by using the output current of the power supply device and a current of a load share bus; and a second control unit for generating a second control signal which controls an output voltage of the power supply device, by using a target voltage of the power supply device, a feedback voltage received as feedback from the output voltage of the power supply device, and a control voltage according to the first control signal of the first control unit, wherein the first control unit generates the first control signal so that the output current is identical to the current of the load share bus, and limits the output current to a threshold current or less.

20 Claims, 11 Drawing Sheets

(51) Int. Cl.
*H02M 1/00* (2006.01)
*H02M 3/155* (2006.01)

(56) References Cited

U.S. PATENT DOCUMENTS

| | | |
|---|---|---|
| 2014/0229755 A1 | 8/2014 | Kris |
| 2015/0146461 A1* | 5/2015 | Deng ................. H05B 45/3725 363/85 |
| 2016/0134135 A1* | 5/2016 | Liu .................... H02J 7/007182 320/107 |
| 2019/0013685 A1* | 1/2019 | Mallapur .................. H02J 1/10 |
| 2019/0305562 A1* | 10/2019 | Begino, III ............... H02J 3/46 |
| 2019/0334442 A1 | 10/2019 | Iyasu et al. |
| 2022/0376514 A1* | 11/2022 | Culpin ..................... H02H 7/26 |

* cited by examiner (A)  (B)

LOAD SHARING CONTROL DEVICE

CROSS REFERENCE TO RELATED APPLICATIONS

This application is the National Phase of PCT International Application No. PCT/KR2021/004278, filed on Apr. 6, 2021, which claims priority under 35 U.S.C. 119(a) to Patent Application No. 10-2020-0042384, filed in the Republic of Korea on Apr. 7, 2020, all of which are hereby expressly incorporated by reference into the present application.

TECHNICAL FIELD

The present invention relates to a load sharing control device, and more particularly, to a load sharing control device and a load sharing control circuit capable of power derating.

BACKGROUND ART

In general, a power supply system is configured by connecting a plurality of power supply devices in parallel in order to stably supply power. In the case of using a plurality of power supplies, there are advantages in heat generation, reliability, redundancy, and modularization compared to the case of using a single power supply.

In a power supply system using a plurality of power supplies, a load sharing controller is built in so as to distribute load uniformly between each power supply. At this time, it is necessary to design a load sharing controller capable of stable operation in various operation modes such as independent operation and constant current-constant voltage (CC-CV) operation when power is supplied using a plurality of power supply devices.

DETAILED DESCRIPTION OF THE INVENTION

Technical Subject

The technical problem to be solved by the present invention is to provide a load sharing control device and a load sharing control circuit capable of power derating.

The problems of the present invention are not limited to the problems mentioned above, and other problems not mentioned will be clearly understood by those skilled in the art from the following description.

Technical Solution

In order to solve the above technical problem, a load sharing control device according to an embodiment of the present invention, in a load sharing control device included in each of multiple power supply devices being connected to a load in parallel, comprises: a first control unit for generating a first control signal which controls an output current of a power supply device, by using the output current of the power supply device and a current of a load share bus; and a second control unit for generating a second control signal which controls an output voltage of the power supply device, by using a target voltage of the power supply device, a feedback voltage received as feedback from the output voltage of the power supply device, and a control voltage according to the first control signal of the first control unit, wherein the first control unit generates the first control signal so that the output current is identical to the current of the load share bus, and limits the output current to a threshold current or less.

In addition, the first control unit may comprise: a first comparison unit for comparing the output current with the current of the load share bus; a first calculation unit for calculating the difference between the output current and the current of the load share bus; and a current control unit for generating the first control signal according to the output of the first calculation unit.

In addition, the current control unit may generate the first control signal for controlling the level of the feedback voltage being inputted to the second control unit. In addition, the first control unit may include a second comparison unit for comparing the output current and the threshold current.

In addition, the second control unit may comprise: a second calculation unit for calculating a difference between the feedback voltage and a control voltage according to the first control signal; a third calculation unit for calculating the difference between the target voltage and the output of the second calculation unit; and a voltage control unit for generating a second control signal for controlling the output voltage of the power supply device according to the output of the third calculation unit.

In addition, at least one of the target voltage and the threshold current may be adjusted according to the limited power of the power supply device.

In order to solve the above technical problem, a load sharing control device according to an embodiment of the present invention, in a load sharing control device included in each of multiple power supply devices being connected to a load in parallel and including a CV circuit or CC-CV circuit, comprises: a maximum current output circuit unit for outputting a larger voltage among an output current sensing voltage sensing an output current of the power supply device and a voltage of a load share bus; a minimum current output circuit unit for outputting a smaller voltage among an output of the maximum current output circuit unit and a voltage according to a threshold current; and an amplification unit for amplifying the difference between the output current sensing voltage and the output of the minimum current output circuit unit and applying it to a CV feedback terminal of the CV circuit or the CC-CV circuit.

In addition, the threshold current may be a preset value or a value obtained by subtracting a predetermined value from the reference current of the CC-CV circuit.

In addition, the maximum current output circuit unit may comprise: a first comparator receiving the output sensing voltage via the positive (+) input terminal and receiving the voltage of the load share bus via the negative (−) input terminal; and a first diode to which the output end of the first comparator and the anode are connected, and the voltage of the load share bus and the cathode are connected.

In addition, the minimum current output circuit unit may include: a second comparator receiving a voltage according to the threshold current via the positive (+) input terminal and receiving an output of the maximum current output circuit unit via the negative (−) input terminal; and a second diode to which the output end of the second comparator and the cathode are connected, and the voltage of the load share bus and the anode are connected.

In addition, the amplification unit may include: a transconductance amplifier for amplifying a difference between the output current sensing voltage and an output of the minimum current output circuit unit; and a first amplifier for amplifying an output of the transconductance amplifier;

and a transistor to which an output terminal of the first amplifier is connected to a base, a negative input terminal of the first amplifier is connected to an emitter, and the CV feedback terminal and a collector are connected.

In addition, the transconductance amplifier may have a predetermined offset voltage.

In addition, it may include a second amplifier for sensing and amplifying the output current to output the output current sensing voltage.

In addition, at least one among the reference voltage of the CC-CV circuit, the reference voltage of the CV circuit, or the threshold current may be adjusted according to the limited power of the power supply device.

In addition, when the load includes a battery, it may be connected to the CC-CV circuit.

Advantageous Effects

According to embodiments of the present invention, while performing load sharing control, independent operation and redundancy are possible, and power derating is possible.

In addition, load sharing is possible in all sections of CC-CV even when the battery load is connected, and even if the output is shorted, the CC control circuit operates so that the device can be protected.

The effect according to the invention is not limited by the contents exemplified above, and more various effects are included in the present specification.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
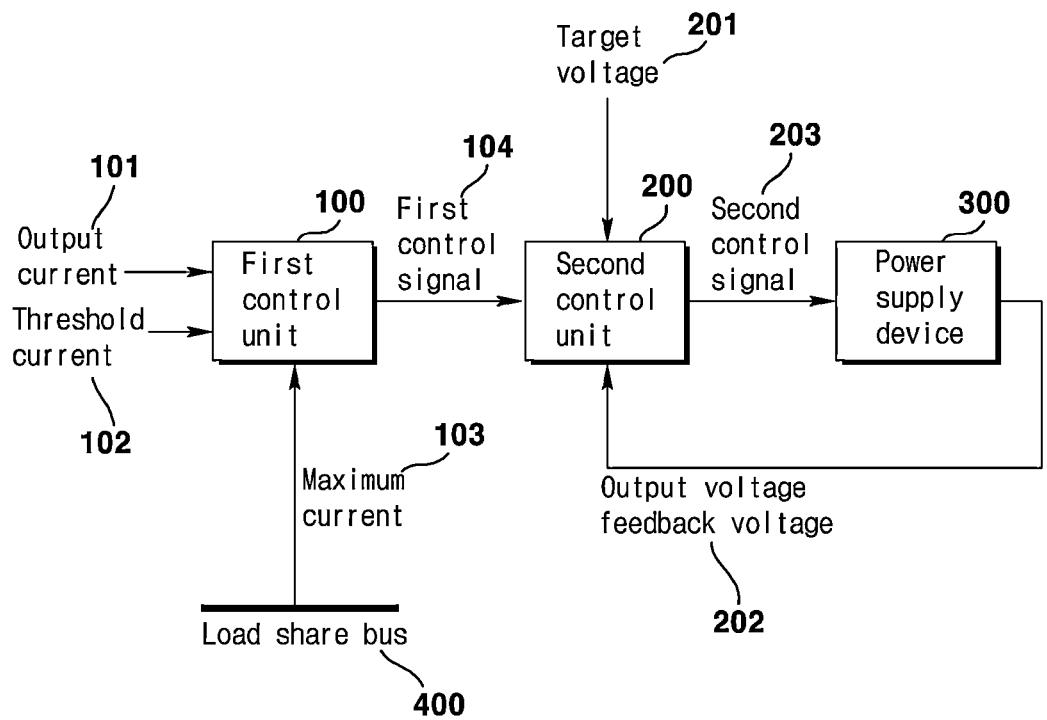
FIG. 1 is a block diagram of a load sharing control device according to an embodiment of the present invention.

FIG. 1 is a block diagram of a load sharing control device according to an embodiment of the present invention.

The load sharing control device according to an embodiment of the present invention is included in each of a plurality of power supply devices connected in parallel to a load, and performs load sharing for equally controlling each output current of the plurality of power supply devices. Here, the power supply device is a PSU, which is a device that supplies power to load, and it may be a device for supplying power for servers, supplying DC-DC power for vehicles, or supplying DC-DC power for DC distribution systems. In addition, it is natural that various devices for supplying power may be included.

The load sharing control device included in each power supply device 300 comprises a first control unit 100 and a second control unit 200. Load sharing is performed using a first control signal 104 being generated by the first control unit 100 and the second control signal 203 being generated by the second control unit 200, but supply power can be limited.

In order to efficiently and stably use the plurality of power supply devices 300, it is necessary to perform various functions.

Figure 2:
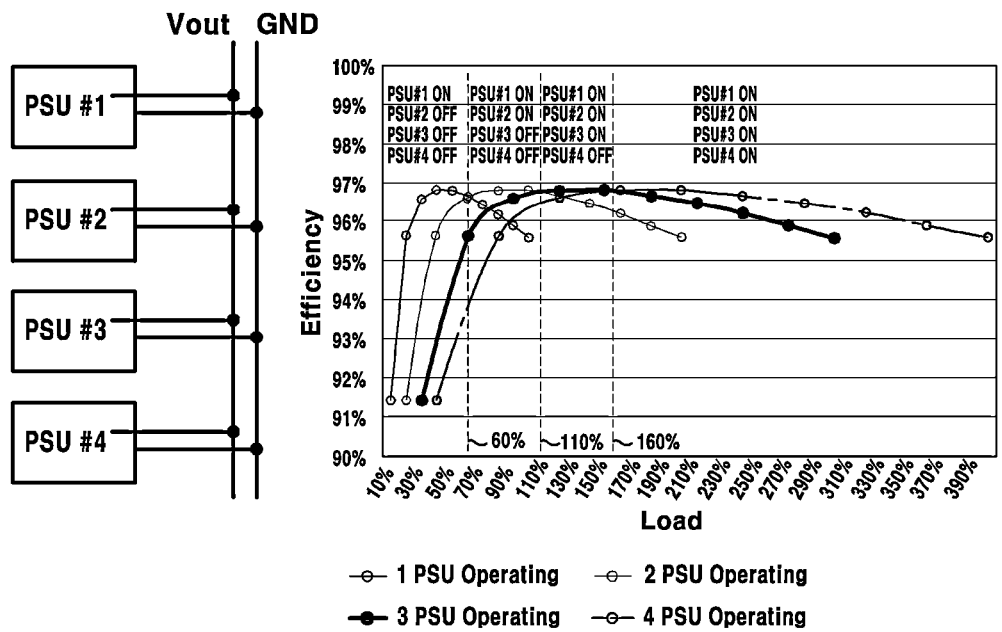
FIGS. 2 to 8 are diagrams for explaining the function of the load sharing control device according to an embodiment of the present invention.

In the case of using a plurality of power supply devices, as shown in FIG. 2, the power supply devices are connected in parallel to each other. At this time, redundancy must be performed for efficient operation. Redundancy means maintaining system output by operating another power supply device when a defect or failure occurs in a certain power supply. In addition, as shown in the graph of FIG. 2, the light load efficiency can be maximized by sequentially driving the power supply device according to the system output load. As shown in FIG. 2, efficiency can be increased by driving: power supply device 1 (PSU #1) up to 60% of the load, power supply device 2 (PSU #2) up to 60 to 110%, power supply device 3 (PSU #3) up to 110 to 160%, and power supply device 4 (PSU #4) up to 160% or more.

Figure 3:
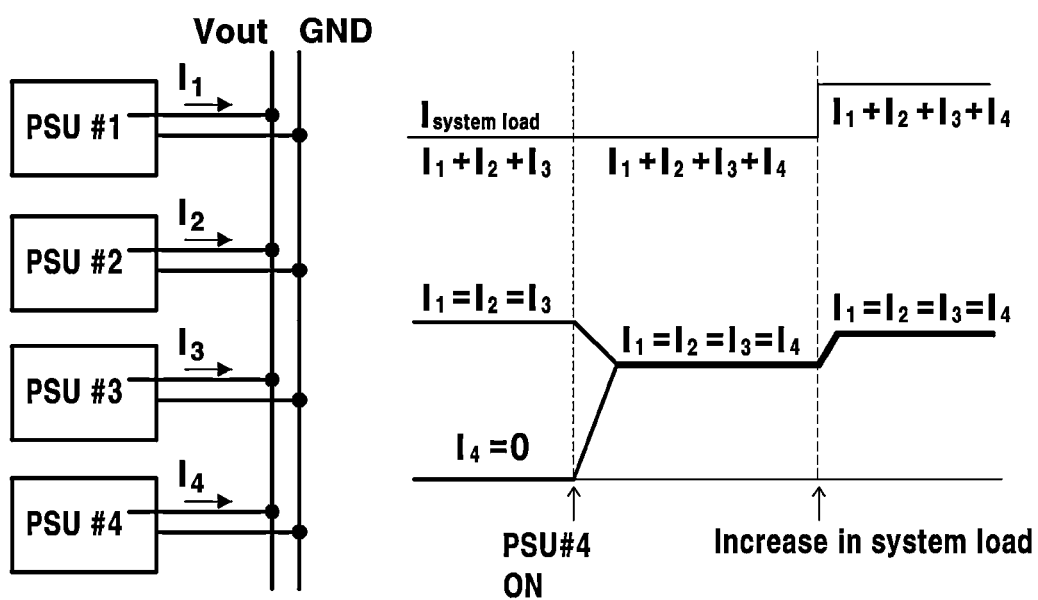

In addition, as shown in FIG. 3, it is necessary to perform load sharing. Load sharing is to control the current being outputted from each power supply device to be the same, and when power supply device 1 (PSU #1) to power supply device 3 (PSU #3) are operated, the system load current I is I1+I2+I3, and load sharing is performed so that I1=I2=I3 through load sharing. After that, when power supply device 4 (PSU #4) is driven, I4 is 0 before driving, and when load sharing is performed so that I1=I2=I3=I4 through load sharing, the value of each current decreases, however, the overall system load current remains the same. After that, when the system load increases, by increasing the value of each current, it is controlled to increase the overall system load current.

Figure 4:
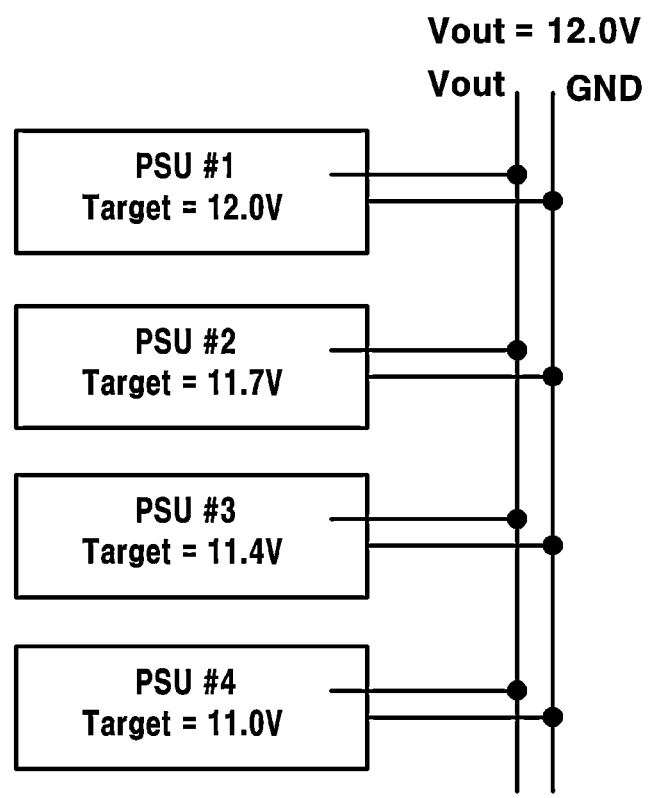

All power supply devices each include an output voltage control device, and there may be a slight difference between the output target voltages due to the deviation of the circuit component characteristics (other than the resistance value) of each output voltage control device, as shown in FIG. 4. In this state, when the outputs of the respective power supply devices are connected in parallel, the system output voltage is controlled to the highest target voltage, and therefore, the power supply device 1 (PSU #1) with the highest target voltage controls the output, and the remaining power supply devices 2, 3, and 4 (PSUs #2, #3, and #4) have an output voltage higher than the target voltage of each power supply device, so that their duty ratio is reduced by each output voltage control device. As a result, power supply to the power supply devices 2, 3, and 4 (PSUs #2, #3, and #4) is reduced, and power supply is concentrated to the power supply device 1 (PSU #1), and thereby occurring a current imbalance. In order to resolve this imbalance, load sharing is necessary.

Figure 5:
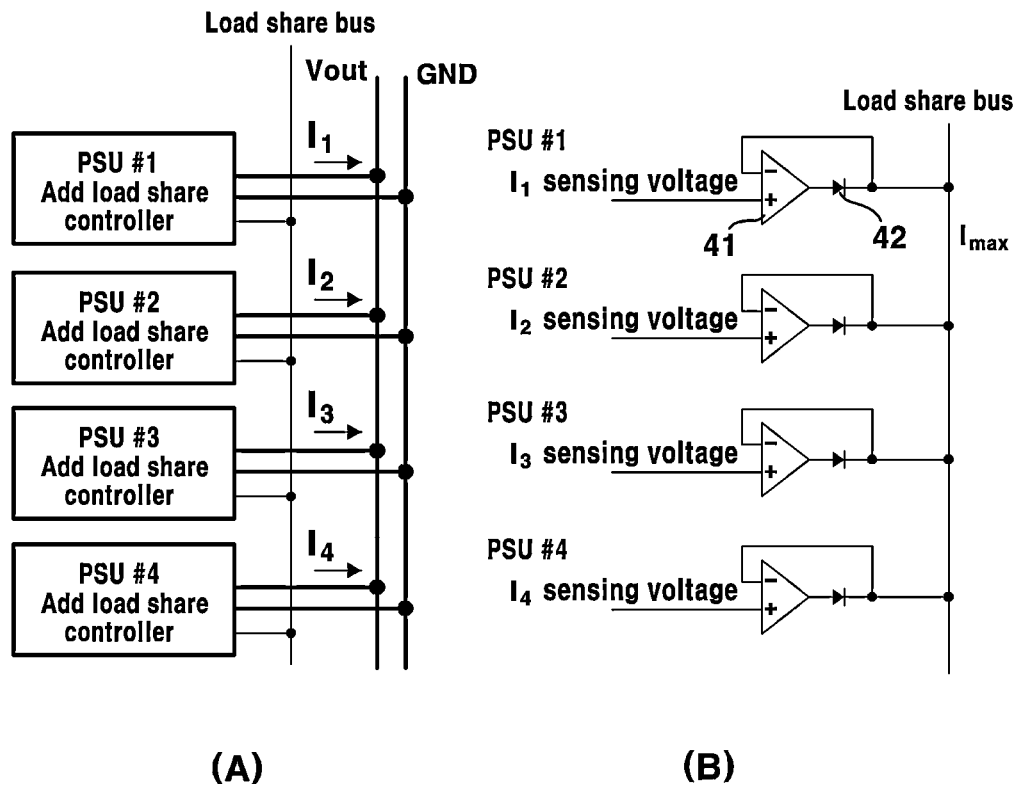

For load sharing, as shown in FIG. 5, a load share bus (load share bus) line is added to the outside of the power supply device and connected, and a load share controller is added inside. Here, the highest output current information among the individual output currents of each power supply device is delivered to the load share bus, and in order to deliver the maximum current through the load share bus, each load share control unit includes a comparator 41 for comparing each output current with the current of the load share bus, and may include a diode 42 for delivering the corresponding output current to the load share bus when the corresponding current is the maximum current. The detected voltage on each output current is applied to the positive (+) input terminal of the comparator 41, and a voltage including the maximum current information is applied to the negative (−) input terminal; when the output current is greater than the maximum current, a high is outputted as an output of the comparator 42 to turned on the diode so that the output current is delivered to the load share bus and the output current is delivered to the other power supply device as a maximum current. When the output current is less than the maximum current, the maximum current is maintained.

When a current imbalance occurs and the output current is lower than the maximum current of the load share bus, the duty ratio is increased by lowering the output voltage feedback signal, and thereby the output current increases, and eventually, the output current increases to become equal to the maximum current. This state can be referred to as a steady-state. Control of the feedback voltage of the output voltage to the output voltage control device is not performed when the target voltage and the output voltage are the same in the stable state where the output current is the same as the maximum current. However, even when the target voltage is lower than the output voltage in the stable state, that is, when the output voltage is 12 V in FIG. 4 and the output is controlled by the power supply device 1 (PSU #1), in order to do load sharing, the feedback voltage of the output voltage to the output voltage control device is lowered, and thereby preventing the duty ratio from being lowered. Through this, supply of power is not concentrated in one power supply device, and load sharing becomes possible.

Figure 6:
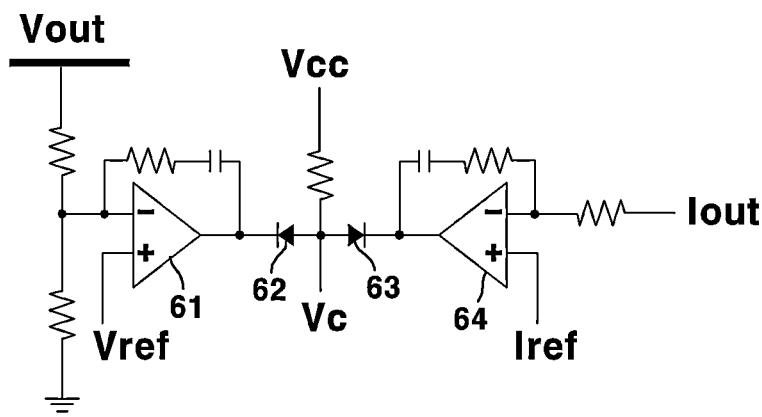

FIG. 6 illustrates a constant current-constant voltage (CC-CV) circuit, and serves to prevent the output voltage and current from becoming excessively high. When the output voltage Vout is lower than the reference voltage Vref, the output of the comparator 61 goes high, thereby opening the diode 62. In addition, when the output current Iout is lower than the reference current Iref, the output of the comparator 64 becomes high, and the diode 63 is opened. That is, Vcc is applied to the control signal voltage Vc for controlling the duty ratio of the power supply device to increase the duty ratio of the power supply device. Here, the control signal voltage Vc may include a switching operation signal and the like for increasing the duty ratio of the power supply device.

As such, when the output current Iout becomes greater than the reference current Iref during operation, the output of the comparator 64 becomes low, the diode 63 is turned on, and thus the control signal voltage Vc is lowered, and accordingly, the duty ratio of the power supply device is also reduced. As a result, it operates so that the output current Iout becomes equal to the reference current Iref, and a mode at this time is referred to as a constant current (CC) mode.

When the output current of the power supply device increases, the output voltage increases, and the output voltage Vout becomes greater than the reference voltage Vref, and the output of comparator 61 goes low, which causes diode 62 to turn on. Due to this, the voltage Vc is lowered, and accordingly, the duty ratio of the power supply device is also lowered. Eventually, it operates so that the output voltage Vout becomes equal to the reference voltage Vref, and a mode at this time is referred to as a constant voltage (CV) mode.

Figure 7:
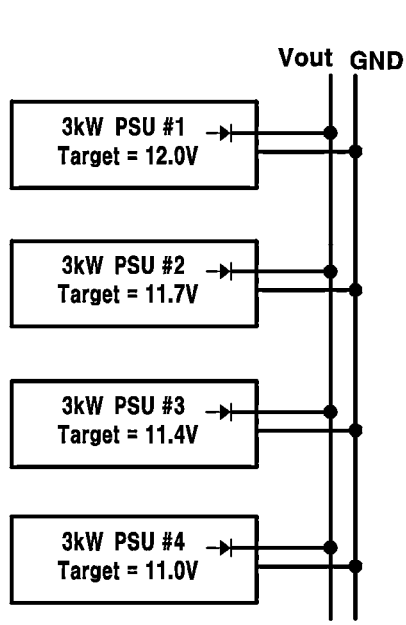
Figure 7:
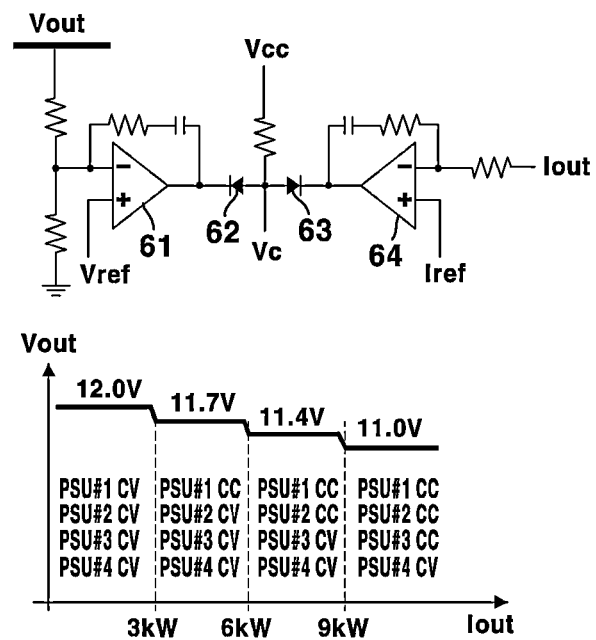

As shown in FIG. 7, when an output diode and a CC-CV circuit are used without a load share bus, parallel operation is possible, but load sharing is not performed. As the output voltage increases, for the same reason as in FIG. 4, the duty ratio of the power supply devices whose target voltage becomes lower than the output voltage decreases, so that the current of each power supply device is not maintained, and thereby occurring a current imbalance.

Figure 8:
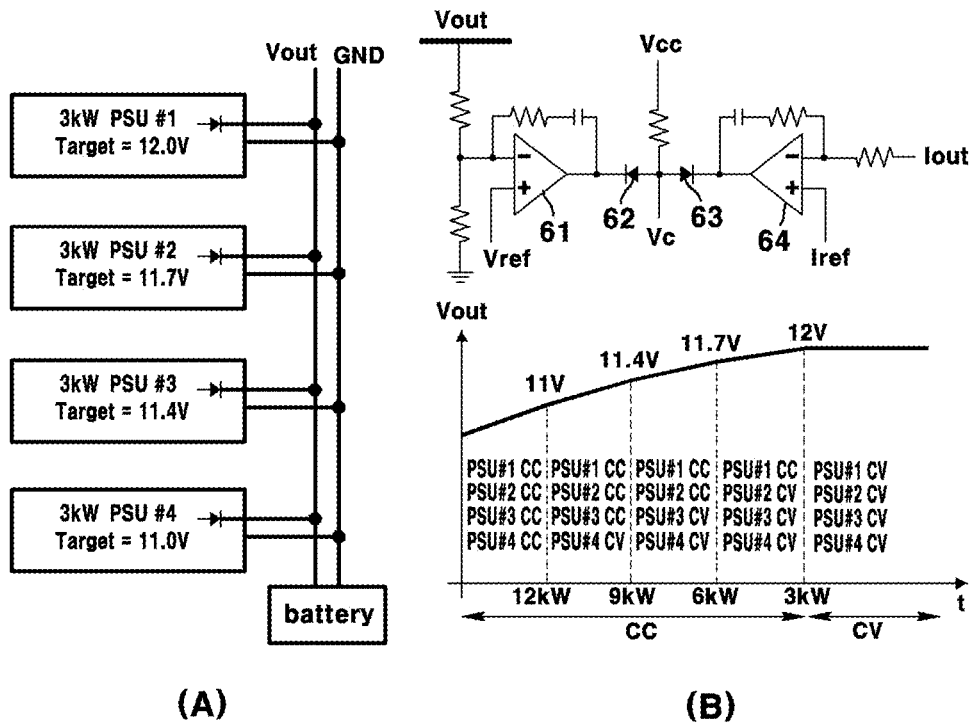

In FIG. 8, in which a battery is connected as a load, for the same reason, as the battery is charged, the duty ratio of the power supply devices in which the target voltage becomes lower than the output voltage decreases, and the current of each power supply device is not maintained, and thereby occurring a current imbalance.

In this way, load sharing is performed even when there is a deviation of the target voltage of the power supply devices, and a load sharing control device according to an embodiment of the present invention includes a first control unit 100 and a second control unit 200 so that load sharing can be performed even in CV mode.

The first control unit 100 generates a first control signal 104 controlling the output current 101 of the power supply device 300 using the output current 101 of the power supply device 300 and the current of the load share bus 400.

More specifically, the first control unit 100 generates the first control signal 104 to follow the maximum current 103 among the output currents of a plurality of power supply devices receiving the output current 101 of the power supply device 300 from the load share bus 400, for road sharing. Here, the first control signal 104 may be a control signal for controlling the second control unit 200 for controlling the output voltage of the power supply device 300. According to the first control signal 104, the output current 101 operates in the same manner as the maximum current 103. At this time, when the output current 101 of the power supply device 300 is the maximum current among the output currents of the other power supply devices, the corresponding output current 101 is delivered to the other power supply device as the maximum current 103 of the load share bus 400.

The first control unit 100 generates a first control signal 104 so that the output current 101 is equal to the maximum current 103 of the load share bus 400, but the output current 101 is limited to the threshold current 102 or less. When there is no limit value of the output current 101, the output current 101 continues to increase, which may affect the entire power supply system. Therefore, for power derating of the power supply, the output current 101 is limited to the threshold current 102 or less. Here, the threshold current 102 has a preset value, or it can be set using the reference current being used when the power supply device is constant current (CC) controlled. When setting the threshold current 102 using a reference current, the threshold current may be set by subtracting a predetermined value from the reference current. Here, the current value subtracted from the reference current may vary depending on the specifications of the power supply device or the degree of safety requirements. Or, the reference current may be set as the threshold current 102.

The second control unit 200 generates a second control signal 203 for controlling the output voltage of the power supply device 300 by using a target voltage 201 of the power supply device 300, a feedback voltage 202 being fed back from the output voltage of the power supply device 300, and a control voltage according to the first control signal 104 of the first control unit 100.

More specifically, the second control unit 200 performs control of the power system of the power supply device 300, and generates a second control signal 203 for controlling the output voltage of the power supply device 300 by using the target voltage 201, the feedback voltage 202, and the first control signal 104. The second control signal 203 for controlling the output voltage of the power supply device 300 is generated such that the voltage obtained by subtracting the control voltage according to the first control signal 104 from the feedback voltage 202 becomes the target voltage 201.

Load sharing for each power supply device 300 is performed by using the first control signal 104 of the first control unit 100 for controlling the output current 101 to be equal to the maximum current 103, and the second control signal 203 of the second control unit 200 for controlling the output voltage of the power supply device 300 so that the voltage obtained by subtracting the control voltage according to the first control signal 104 from the feedback voltage 202 becomes the target voltage 201; and the first control unit 100 performs power derating by limiting the output current 101 to the threshold current 102 or less.

Figure 9:
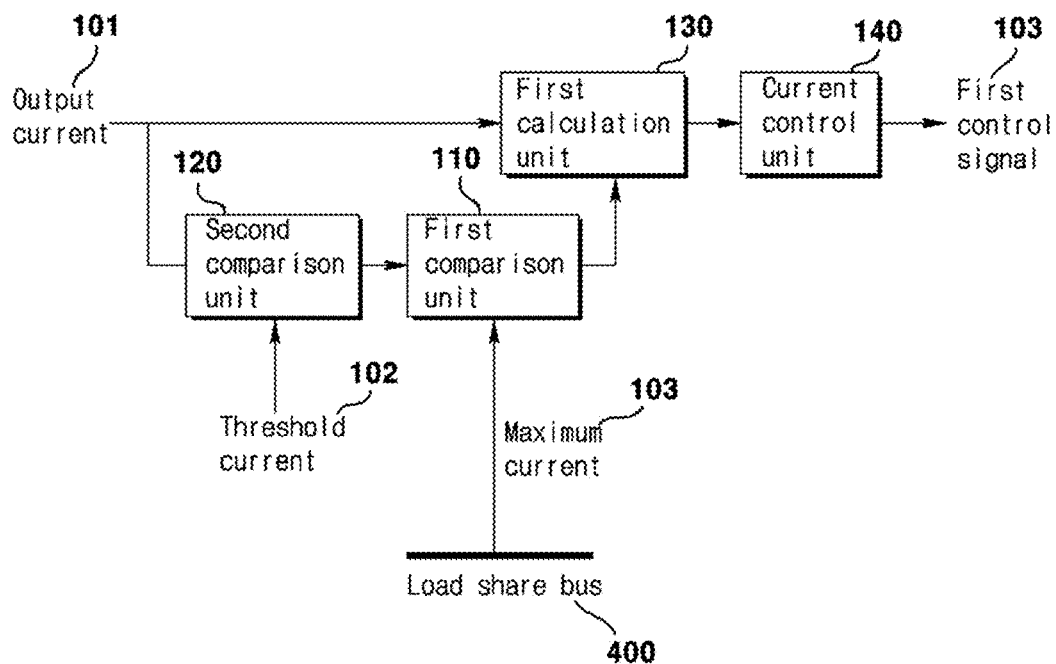
FIG. 9 is a block diagram of a first control unit of a load sharing control device according to an embodiment of the present invention.

FIG. 9 is a block diagram of a first control unit of a load sharing control device according to an embodiment of the present invention.

The first control unit 100 of the load sharing control device according to an embodiment of the present invention may comprise a first comparison unit 110, a first calculation unit 130, and a current control unit 140 as shown in FIG. 9, and may include a second comparison unit 120. In generating the first control signal, currents are compared or calculated, and at this time, a sensing voltage, not a current, that measures current, may be used in comparing currents. That is, in comparing between the currents, a comparison may be performed between the sensing voltages sensing the respective currents.

The first comparison unit 110 compares the output current 101 and the current of the load share bus 400. The first comparison unit 110 compares the output current 101 and the maximum current 103, and determines which of the output current 101 and the maximum current 103 is larger. When the output current 101 is greater than the maximum current 103, the maximum current of the load share bus 400 is changed to the output current 101.

The first calculation unit 130 calculates the difference between the output current 101 and the current of the load share bus 400. The first control unit 100 controls the output current 101 to be equal to the maximum current 103, and the first calculation unit 130 calculates the difference between the output current 101 and the maximum current 103 in order to determine whether the output current 101 and the maximum current 103 are the same and at the same time generate a first control signal using the difference between the output current 101 and the maximum current 103.

The current control unit 140 generates a first control signal according to the output of the first calculation unit 130. That is, the first control signal is generated to reduce the corresponding difference according to the difference between the output current 101 and the maximum current 103 being outputted from the first calculation unit 130. The current control unit 140 may generate the first control signal 104 for controlling the level of the feedback voltage 202 being inputted to the second control unit 200. When the output current 101 is lower than the maximum current 103, it is necessary to control to increase the output current 101, and for this, the duty ratio of the power supply device 300 must be increased. That is, by lowering the feedback voltage of the output voltage being used by the second control unit 200 for controlling the duty ratio of the power supply device 300 to control the duty ratio than the actual feedback voltage, it is possible to prevent the second control unit 200 from lowering the duty ratio according to the actual feedback voltage.

The output current gradually increases according to the first control signal of the current control unit 140, and in order to limit excessively high power supply, the first control unit 100 may include a second comparison unit 120 for limiting the output current to a threshold current. The second comparison unit 120 compares the output current 101 and the threshold current 102 so that a lower current is applied to the first comparison unit 110. That is, when the output current 101 becomes greater than the threshold current 102, the second comparison unit 120 outputs a threshold current 102 as an output, and the threshold current 102 is set to be greater than the maximum current 103, and the threshold current 102 is outputted as an output of the first comparison unit 110. Then, the output current 101 is controlled to be equal to the threshold current 102 by the first calculation unit 130 and the current control unit 140, and the output current 101 is limited to the threshold current 102. At this time, the threshold current may be set to a maximum current value to be controlled by load sharing. Or, it may be set to a current value for limiting the supply power.

Figure 10:
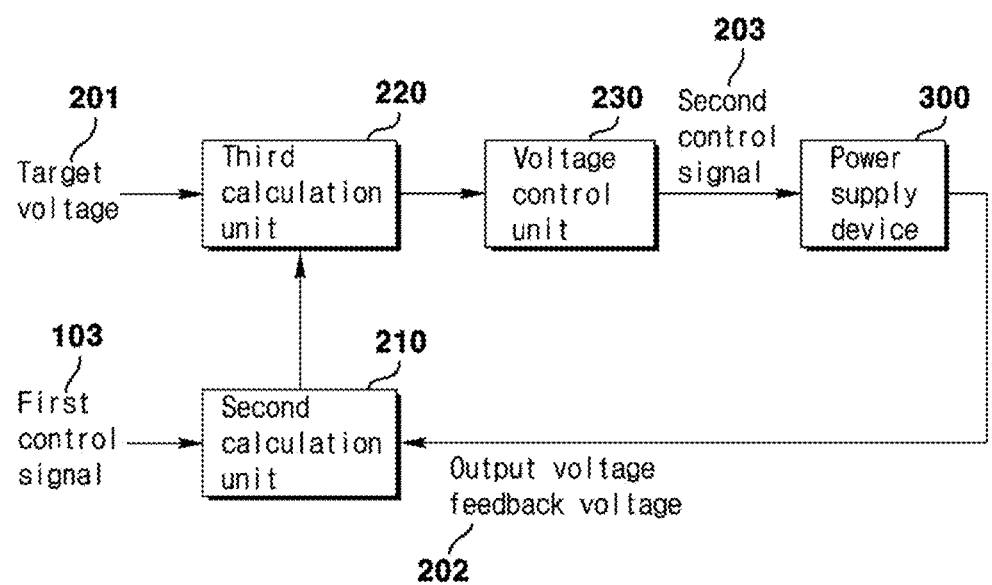
FIG. 10 is a block diagram of a second control unit of a load sharing control device according to an embodiment of the present invention.

FIG. 10 is a block diagram of a second control unit of a load sharing control device according to an embodiment of the present invention.

The second control unit 200 of the load sharing control device according to the embodiment of the present invention, as shown in FIG. 10, may comprise a second calculation unit 210, a third calculation unit 220, and a voltage control unit 230.

The second calculation unit 210 calculates a difference between the feedback voltage 202 and the control voltage according to the first control signal 104. As previously described, the first control signal 104 is a control signal for lowering or increasing the feedback voltage 202 of the output voltage, the difference between the feedback voltage 202 and the control voltage according to the first control signal 104 is calculated in order to lower or increase the feedback voltage 202 as much as the control voltage according to the first control signal 104.

The third calculation unit 220 calculates the difference between the output of the target voltage 201 and the second calculation unit 210. The voltage control unit 230 for controlling the duty ratio of the power supply device controls so that the output voltage becomes the target voltage 201. To this end, the third calculation unit 220 calculates and outputs the difference between the output of the target voltage 201 and the second calculation unit 210.

The voltage control unit 230 generates a second control signal 203 for controlling the output voltage of the power supply device so that the output voltage becomes the target voltage according to the output of the third calculation unit 220. The second control signal 203 is a signal for controlling the power supply of the power supply device 300. The voltage control unit 230 may include a pulse width modulator (PWM). In order to control the duty ratio for controlling the power supply of the power supply device 300, it may include a pulse width modulator capable of controlling the duty ratio of the signal, thereby controlling the duty ratio of the power supply device.

When it is necessary to limit the supply power for each power supply device 300, at least one of the target voltage 201 and the threshold current 102 may be adjusted. Since supply power is controlled by the output voltage and output current, the output voltage is limited to the target voltage 201, and the output current is limited to the threshold current 102, the supply power may be limited by adjusting at least one of the target voltage 201 and the threshold current 102. That is, through this, power derating, which is a supply power limitation, is possible.

Figure 11:
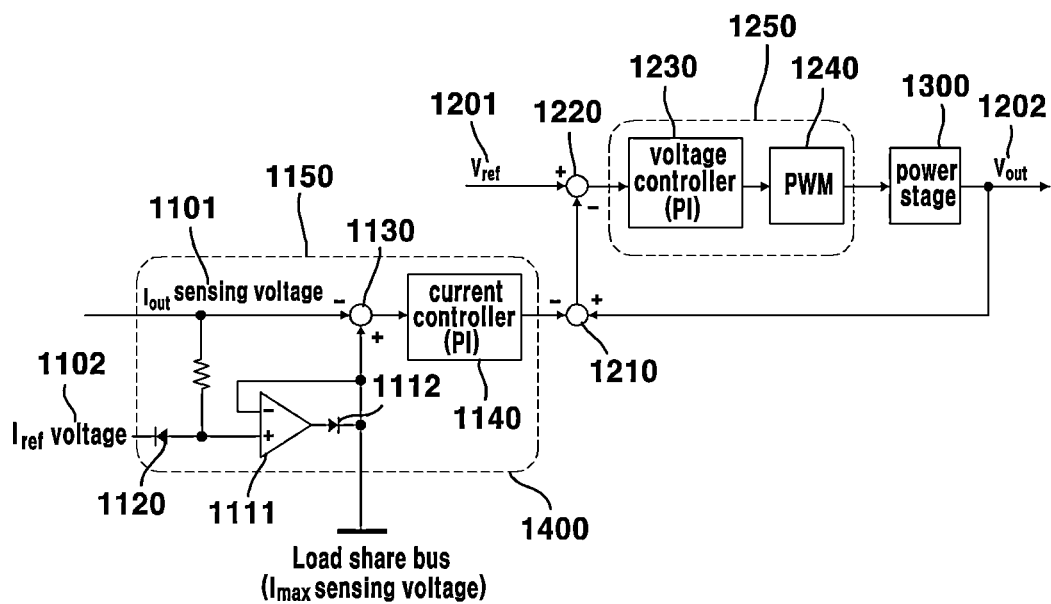
FIG. 11 illustrates an implementation example of a load sharing control device according to an embodiment of the present invention.

A load sharing control device according to an embodiment of the present invention may be implemented as shown in FIG. 11.

Comparison of output current, maximum current, and threshold current can be performed using the sensing voltage or set voltage of each current. The output current sensing voltage 1101 is compared with the maximum current sensing voltage of the load share bus 1400 through the comparator 1111 and the diode 1112 so that it can deliver the largest output current among the output currents of each power supply device. The difference between the output current sensing voltage 1101 and the sensing voltage 1400 of the maximum current is calculated (1130), and according to the corresponding difference, the current control unit 1140 generates a first control signal so that the sensing voltage 1101 of the output current becomes equal to the sensing voltage 1400 of the maximum current. At this time, the current control unit 1140 may perform control through PI control. As a result, the output current increases, and the output voltage sensing voltage 1101 increases accordingly, and comparison may be performed with the threshold current voltage 1102 and the diode 1120 in order to limit the magnitude of the output voltage sensing voltage 1101. When the output current sensing voltage 1101 is greater than the threshold current voltage 1102, the diode is turned on and the threshold current voltage 1102 is inputted to the positive (+) terminal input of the comparator 1111, and since the threshold current voltage 1102 is greater than the sensing voltage 1400 of the maximum current, the output current sensing voltage 1101 is controlled to be equal to the threshold current voltage 1102 by the current control unit 1140, so that the output current is limited to the threshold current. In this way, since the output current is limited to the threshold current to operate in the constant current mode, components that perform load sharing may be referred to as a load sharing controller (CC controller 1150).

The control voltage according to the control signal of the current control unit 1140 is used to control the feedback voltage of the output voltage 1202. That is, the difference between the feedback voltage of the output voltage 1202 and the control voltage according to the control signal of the current control unit 1140 is calculated (1210), and the difference from the target voltage 1201 is calculated (1220) according to the result. The voltage control unit 1230 generates a second control signal so that the difference between the feedback voltage of the output voltage 1202 and the control voltage according to the control signal of the current control unit 1140 is equal to the target voltage 1201. At this time, the voltage control unit 1230 may perform control through PI control. The control signal of the voltage control unit 1230 is applied to the pulse width modulator (PWM, 1240), so that it is possible to control the duty ratio of the signal being applied to a power stage 1300 of the power supply device. Since the voltage control unit 1230 and the pulse width modulator 1240 limit the voltage to the target voltage to operate in a constant voltage mode, it may be referred to as a CV controller 1250.

Figure 12:
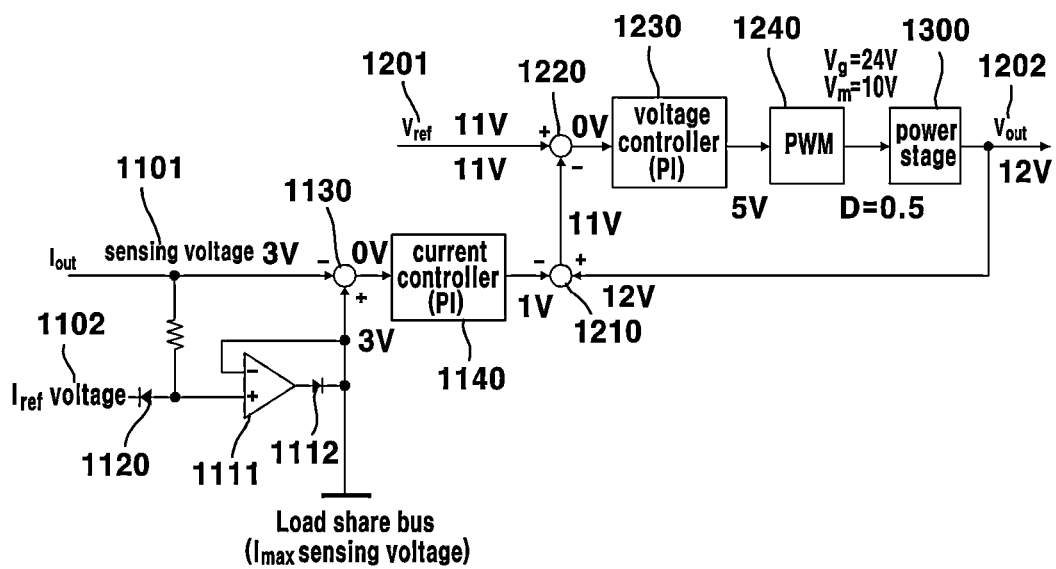
FIGS. 12 to 13 are diagrams for explaining the operation of each case of the load sharing control device according to an embodiment of the present invention.

The load sharing control device being implemented as shown in FIG. 11 may operate as shown in FIG. 12 when the load battery voltage is higher than the target voltage in a CC mode where the output current is stabilized to the maximum current, or when the battery voltage is controlled by another power supply device in a CV mode in which the output voltage is stabilized to the target voltage. For example, when the battery voltage is 12 V and the target voltage is 11 V, since the output current is in a stabilized state at the maximum current, the output from the calculation unit 1130 is 0, and the control voltage according to the control signal being outputted from the current control unit 1140 may be 1 V to lower the 12 V feedback voltage of the output voltage to the target voltage of 11 V. The duty ratio of the power supply device can be controlled so that 0 V is inputted as the difference between the target voltage being inputted to the voltage control unit 1230 and the feedback voltage of the output voltage. That is, 5 V is outputted, and the PWM outputs Vg=24 V, Vm=10 V, and duty ratio D=0.5, so that load sharing of power supply devices can be performed.

Figure 13:
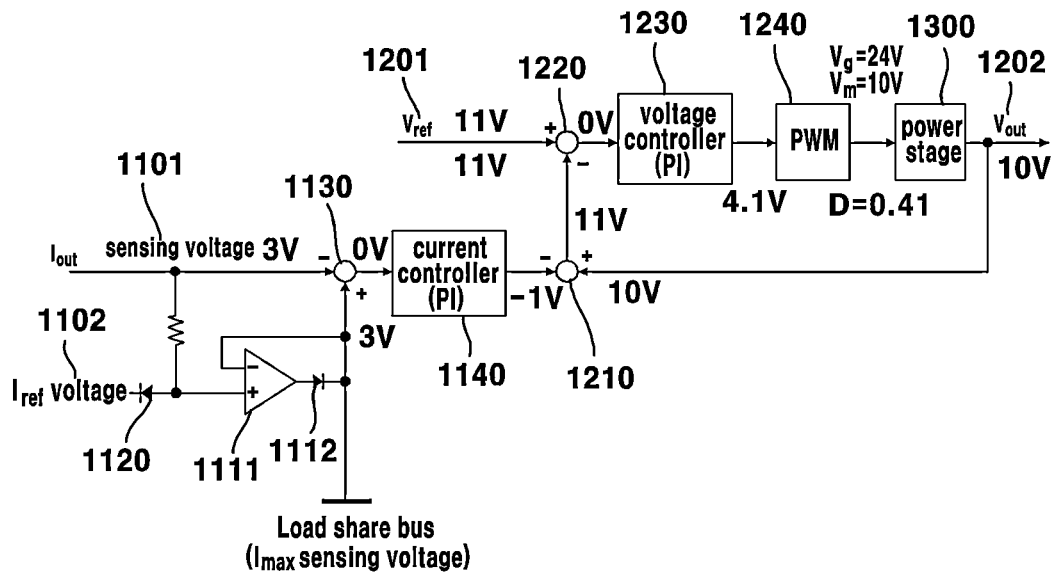

In the CC mode, when the battery voltage is lower than the target voltage, the operation may be performed as shown in FIG. 13. For example, when the battery voltage is 10 V and the target voltage is 11 V, the output current is stabilized at the maximum current, the output from the calculation unit 1130 is 0, and accordingly, the control voltage according to the control signal being outputted from the current control unit 1140 may be −1 V to increase the feedback voltage of 10 V according to the output voltage to the target voltage of 11 V. The duty ratio of the power supply device can be controlled so that 0 V is inputted as the difference between the target voltage being inputted to the voltage control unit 1230 and the feedback voltage of the output voltage. That is, 4.1 V is outputted, and the PWM outputs Vg=24 V, Vm=10 V, and duty ratio D=0.5, so that load sharing of the power supply device can be performed.

In the load sharing control circuit connected in parallel to the load and included in each of a plurality of power supply devices including a CV circuit or a CC-CV circuit, a load sharing control circuit according to an embodiment of the present invention may comprise: a maximum current output circuit unit for outputting the larger voltage among the output current sensing voltage sensing the output current of the power supply device and the voltage of the load share bus; a minimum current output circuit unit for outputting the smaller voltage among the output of the maximum current output circuit unit and a voltage according to a threshold current; and an amplification unit amplifying the difference between the output current sensing voltage and the output of the minimum current output circuit unit and applying it to a CV feedback terminal of the CV circuit or the CC-CV circuit.

Figure 14:
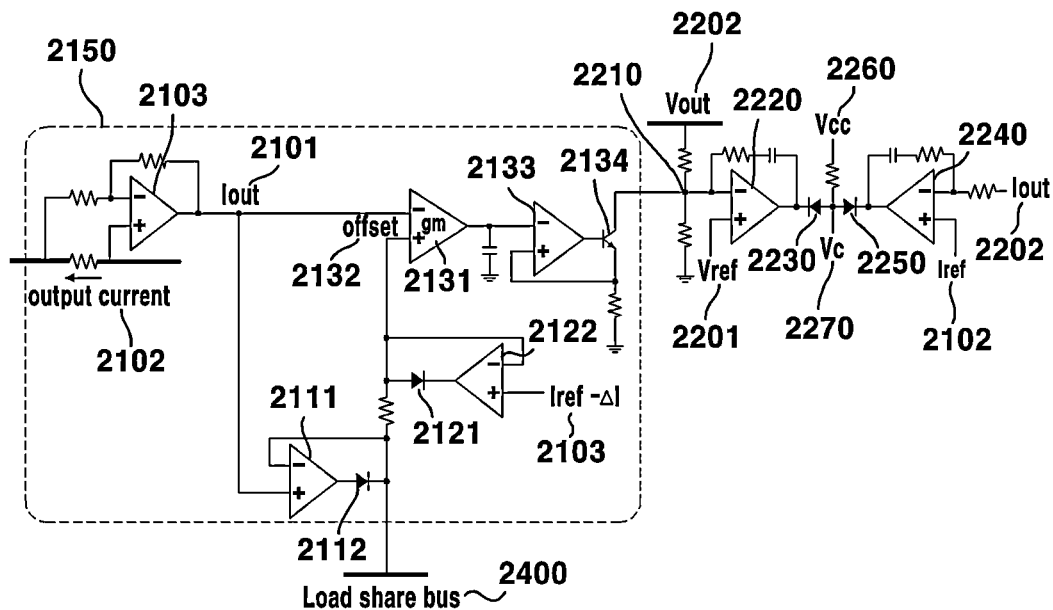
FIG. 14 is a circuit diagram of a load sharing control circuit according to an embodiment of the present invention.
Figure 15:
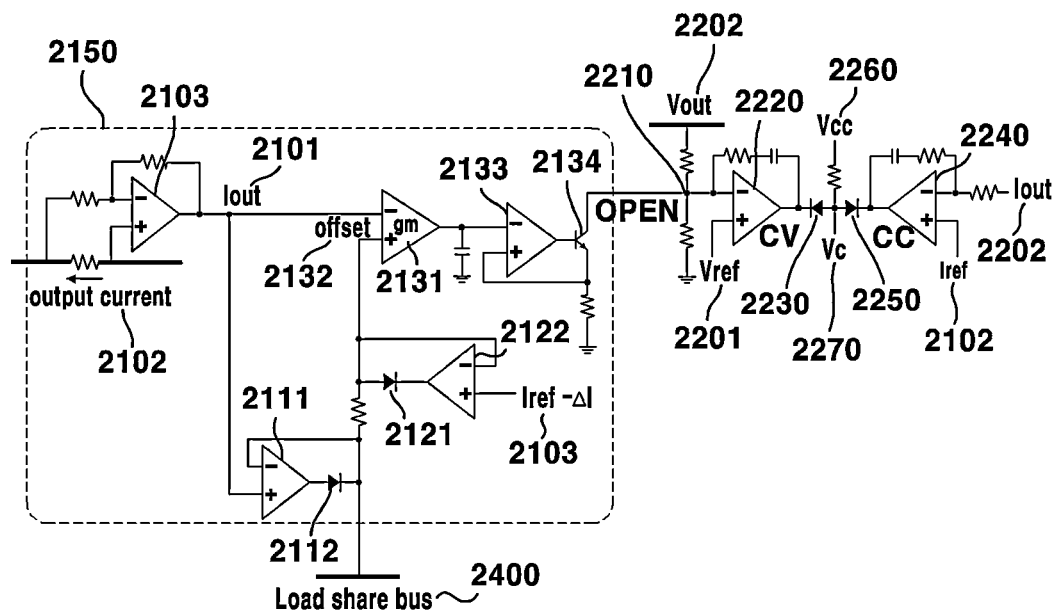
FIGS. 15 to 17 are diagrams for explaining the operation of each case of the load sharing control circuit according to an embodiment of the present invention.

FIG. 14 is a circuit diagram of a load sharing control circuit according to an embodiment of the present invention.

The load sharing control circuit 2150 according to an embodiment of the present invention is a circuit corresponding to the load sharing control device described with reference to FIGS. 1 to 13, and hereinafter, overlapping descriptions will be omitted. As described in FIG. 13, it is necessary to apply a negative (−) value as a control voltage to be subtracted from the feedback voltage of the output voltage in order to perform load sharing, and in order to implement this as an analog circuit, as shown in FIG. 14, a load sharing control circuit according to an embodiment of the present invention may be implemented.

The maximum current output circuit unit may comprise: a first comparator 2111 receiving the output current sensing voltage 1201 via the positive (+) input terminal, and receiving the voltage of the load share bus 2400 via the negative (−) input terminal; and a first diode 2112 to which the output end of the first comparator 2111 and the anode are connected, and the voltage of the load share bus 2400 and the cathode are connected. It may include a second amplifier 2103 sensing and amplifying the output current and outputting an output current sensing voltage 2101. Precise sensing of the output current is possible by sensing and amplifying the output current 2102 by the second amplifier 2103. Here, the second amplifier may be a high-precision OP-AMP. In addition, the first comparator 2111 may be implemented as an OP-AMP comparator or the like. The larger voltage of the voltages of the output current 2101 or the voltage of the load share bus 2400 is outputted as the voltage of the maximum current by the first comparator 2111 and the first diode 2112.

Minimum current output circuit unit may include: a second comparator 2122 receiving the voltage according to the threshold current 2103 via the positive (+) input terminal, and receiving the output of the maximum current output circuit unit via the negative (−) input terminal; and a second diode 2121 to which the output terminal and the cathode of the second comparator 2122 are connected, and the voltage of the load share bus 2400 and the anode are connected. Here, the threshold current 2103 may be a preset value or a value (Iref−ΔI) obtained by subtracting a predetermined value ΔI from the reference current Iref of the CC-CV circuit. Since the cathode-anode direction of the second diode 2121 is opposite to the direction of the first diode 2112, the smaller voltage among the voltage according to the threshold current 2103 and the output of the maximum current output circuit unit is outputted and applied to the amplification unit. That is, the positive (+) input of the transconductance amplifier 2131 comprising the amplification unit may be limited to the voltage of the threshold current.

The amplification unit may include: a transconductance amplifier 2131 for amplifying the difference between the output current 1201 sensing voltage and the output of the minimum current output circuit unit; a first amplifier 2133 for amplifying the output of the transconductance amplifier 2131; and a transistor 2134 whose base is connected with the output end of the first amplifier 2133, emitter is connected with the negative (−) input terminal of the first amplifier, and collector is connected with the CV feedback terminal 2210. The transconductance amplifier is an amplifier that multiplies the difference in voltage input by a gain and outputs it as a current, and amplifies the difference between the output current 1201 sensing voltage and the output of the minimum current output circuit unit, and outputs it. The transconductance amplifier 2131 may have a predetermined offset voltage 2132. Through this, when the difference between the sensing voltage 1201 of the output current and the sensing voltage of the maximum current is equal to or greater than the offset voltage, the current control function can be operated. Through this, it is possible to prevent errors such as current control due to malfunction of the amplifier. Here, the offset voltage may be preset and may be set to 25 mV. The output of the transconductance amplifier 2131 is amplified in the first amplifier 2133, and by applying a voltage to the resistor connected to the emitter of the transistor 2134, the voltage of the CV feedback terminal 2210 being connected to the collector of the transistor 2134 is decreased or increased. That is, the voltage of the CV feedback terminal 2210 may be controlled to positive (+) or negative (−). Through this, even in a CV mode in which the output voltage 2202 becomes greater than the reference voltage 2201 which is the target voltage, the power supply device may be operated to enable load sharing.

As previously described, in the implemented load sharing control circuit, at least one among the reference voltage of the CC-CV circuit, the reference voltage of the CV circuit, or the threshold current can be adjusted depending on the power limit of the power supply device. For each power supply device 300, if it is necessary to limit the supply power, at least one among the reference voltage of the CC-CV circuit, the reference voltage of the CV circuit corresponding to the target voltage, or the threshold current may be adjusted. Since the supply power is controlled by the output voltage and the output current, the output voltage is limited by the reference voltage, and the output current is limited by the threshold current, supply power may be limited by adjusting at least one of a reference voltage and a threshold current. That is, through this, power derating, which is a supply power limitation, is possible.

As shown in FIG. 14, a load sharing control circuit being implemented according to the embodiment of the present invention may operate in various operating modes.

In the case of stand-alone operation rather than parallel operation with other power supply devices, as shown in FIG.

15, the load sharing control circuit 2150 is equivalently opened, so that only the CC-CV circuit operates.

Figure 16:
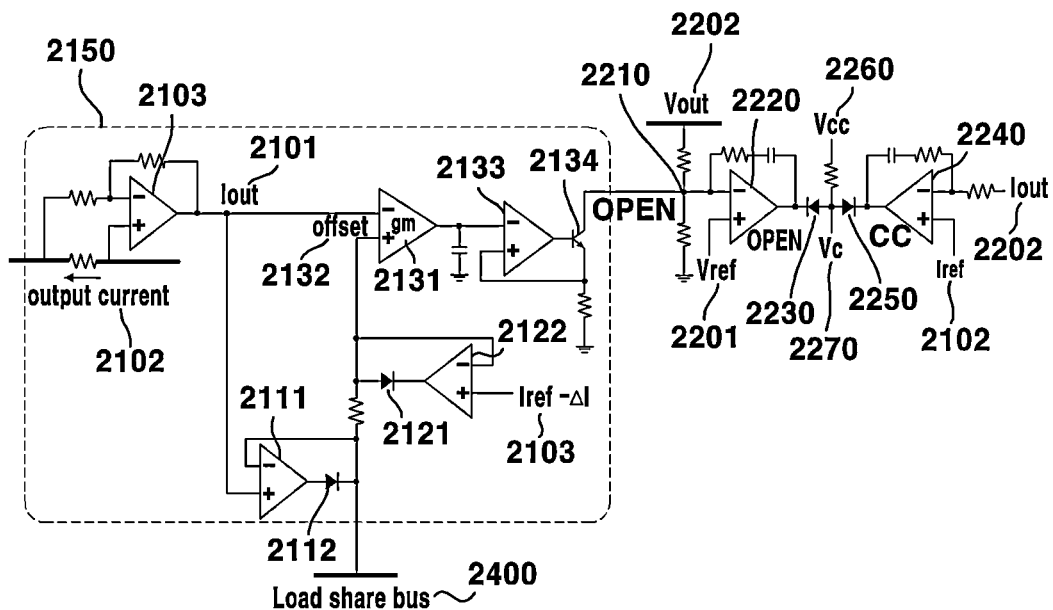

When driving in parallel with other power supply devices, when the output voltage is lower than the target voltage, as shown in FIG. 16, it is operated in a CC mode, and the CV circuit and the load sharing control circuit 2150 are equivalently opened. It is controlled to operate in a way that the output current 2202 is limited to the reference current 2102 by the CC circuit.

Figure 17:
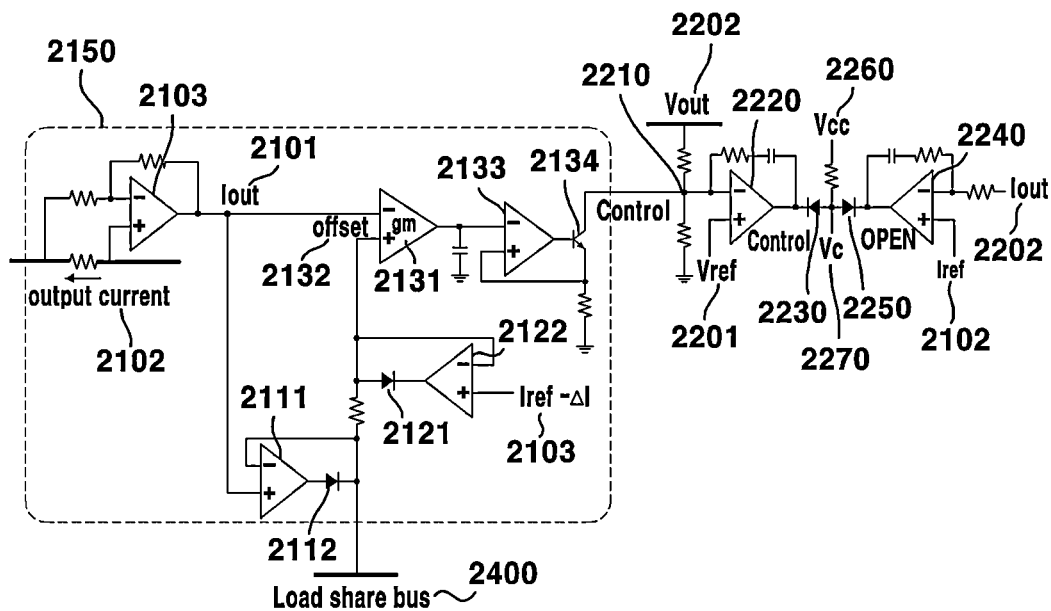

When driving in parallel with other power supply devices, and when the output voltage is higher than the target voltage, as shown in FIG. 17, while operating in a CV mode, the load sharing control circuit 2150 operates for load sharing. At this time, the CC circuit is equivalently opened. At this time, the load sharing is performed, but it is controlled to operate in a way that the output current is limited to the threshold current 2103, not the reference current 2102.

Figure 18:
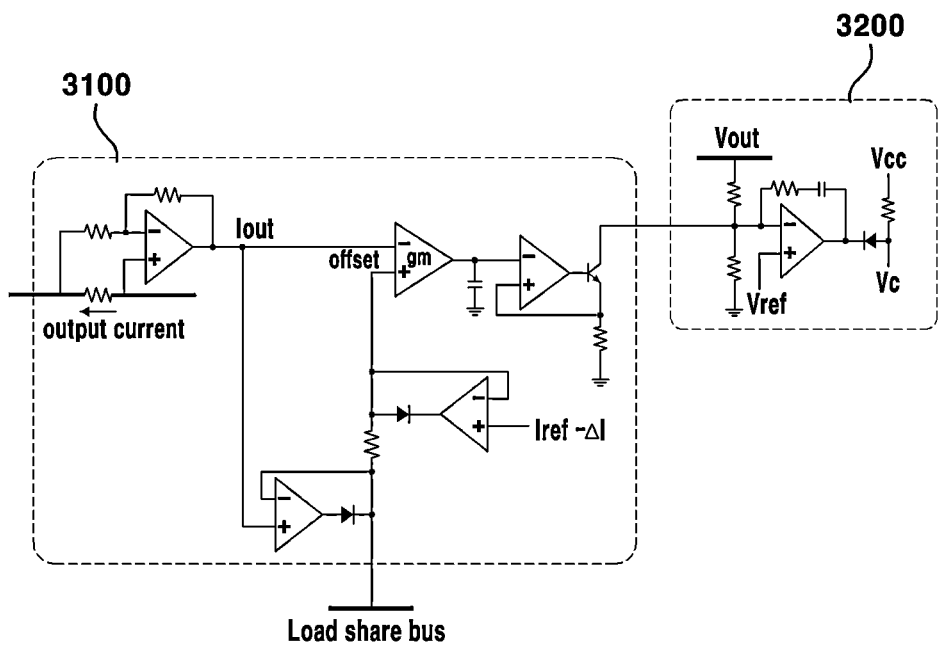
FIG. 18 is a circuit diagram of a load sharing control circuit according to another embodiment of the present invention.

When the battery is connected to the load, as shown in FIG. 14, the load sharing control circuit 2150 is connected to the CC-CV circuit and operates, and when the battery is not connected to the load, as shown in FIG. 18, the load sharing control circuit 2150 may operate by being connected only to the CV-circuit, not the CC-CV circuit. That is, load sharing may be performed by being included in a power supply device applied to various applications and loads that supply power for a server, supply DC-DC power for a vehicle, or supply DC-DC power for a DC distribution system. Other than this, it is natural that various devices for supplying power may be included.

As described above, through a load sharing control device or control circuit capable of power derating, stand-alone operation is possible, a redundancy function is performed, and power derating is possible by adjusting the target voltage and threshold current. In addition, load sharing operation is possible in all sections of CC-CV even when the battery is connected to the load, and the CC control circuit is operated when the output is short-circuited so that the elements can be protected.

It is natural that each configuration of the load sharing control device according to an embodiment of the present invention may be implemented by software or hardware such as a circuit.

Although embodiments of the present invention have been described with reference to the accompanying drawings, those of ordinary skill in the art to which the present invention belongs will be able to understand that the present invention can be embodied in other specific forms without changing its technical spirit or essential features. Therefore, it should be understood that the embodiments described above are illustrative in all respects and not restrictive.

The invention claimed is:

1. A load sharing control device comprising:
a first control unit configured to generate a first control signal which controls an output current of a power supply device, by using the output current of the power supply device and a current of a load share bus; and
a second control unit configured to generate a second control signal which controls an output voltage of the power supply device, by using a target voltage of the power supply device, a feedback voltage received as feedback from the output voltage of the power supply device, and a control voltage according to the first control signal of the first control unit,
wherein the first control unit generates the first control signal so that the output current is identical to the current of the load share bus, and limits the output current to a threshold current or less.

2. The load sharing control device according to claim 1, wherein the first control unit comprises:
a first comparison unit configured to compare the output current with the current of the load share bus;
a first calculation unit configured to calculate a difference between the output current and the current of the load share bus; and
a current control unit configured to generate the first control signal according to an output of the first calculation unit.

3. The load sharing control device according to claim 2, wherein the current control unit generates the first control signal for controlling a level of the feedback voltage being inputted to the second control unit.

4. The load sharing control device according to claim 1, wherein the first control unit comprises a second comparison unit for comparing the output current and the threshold current.

5. The load sharing control device according to claim 1, wherein the second control unit comprises:
a second calculation unit configured to calculate a difference between the feedback voltage and the control voltage according to the first control signal;
a third calculation unit configured to calculate a difference between the target voltage and an output of the second calculation unit; and
a voltage control unit configured to generate the second control signal for controlling the output voltage of the power supply device according to an output of the third calculation unit.

6. The load sharing control device according to claim 1, wherein the voltage control unit comprises a PWM unit configured to control a duty of the power supply device.

7. The load sharing control device according to claim 1, wherein at least one of the target voltage and the threshold current is adjusted according to a limited power of the power supply device.

8. The load sharing control device according to claim 1, wherein the load sharing control device is included in each of multiple power supply devices being connected to a load in parallel.

9. The load sharing control device according to claim 1, comprising:
a CV circuit or CC-CV circuit.

10. A load sharing control circuit comprising:
a maximum current output circuit unit configured to output a larger voltage between an output current sensing voltage sensing an output current of a power supply device and a voltage of a load share bus;
a minimum current output circuit unit configured to output a smaller voltage between an output of the maximum current output circuit unit and a voltage according to a threshold current; and
an amplification unit configured to amplify a difference between the output current sensing voltage and an output of the minimum current output circuit unit and apply it to a CV feedback terminal of a CV circuit or a CC-CV circuit.

11. The load sharing control circuit according to claim 10, wherein the threshold current is a preset value or a value obtained by subtracting a predetermined value from a reference current of the CC-CV circuit.

12. The load sharing control circuit according to claim 10, wherein the maximum current output circuit unit comprises:
a first comparator receiving the output sensing voltage via a positive (+) input terminal and receiving the voltage of the load share bus via a negative (−) input terminal; and
a first diode of which an anode is connected to an output end of the first comparator, and a cathode is connected to the voltage of the load share bus.

13. The load sharing control circuit according to claim 10, wherein the minimum current output circuit comprises:
a second comparator receiving a voltage according to the threshold current via a positive (+) input terminal and receiving an output of the maximum current output circuit unit via a negative (−) input terminal; and
a second diode of which a cathode is connected to an output end of the second comparator, and an anode is connected to the voltage of the load share bus.

14. The load sharing control circuit according to claim 10, wherein the amplification unit comprises:
a transconductance amplifier configured to amplify a difference between the output current sensing voltage and an output of the minimum current output circuit unit; and
a first amplifier configured to amplify an output of the transconductance amplifier; and
a transistor of which a base is connected to an output terminal of the first amplifier, an emitter is connected to a negative (−) input terminal of the first amplifier, and a collector is connected to the CV feedback terminal.

15. The load sharing control circuit according to claim 14, wherein, the transconductance amplifier have a predetermined offset voltage.

16. The load sharing control circuit according to claim 15, wherein, the transconductance amplifier amplifies the difference between the output current sensing voltage and an output of the minimum current output circuit unit when the difference between the output current sensing voltage and an output of the minimum current output circuit unit is equal to or more than the predetermined offset voltage.

17. The load sharing control circuit according to claim 10, comprising:
a second amplifier configured to sense and amplify the output current and output the output current sensing voltage.

18. The load sharing control circuit according to claim 10, wherein at least one among a reference voltage of the CC-CV circuit, a reference voltage of the CV circuit, or the threshold current is adjusted according to a limited power of the power supply device.

19. The load sharing control circuit according to claim 10, wherein the load sharing control circuit is included in each of multiple power supply devices being connected to a load in parallel and including a CV circuit or CC-CV circuit.

20. The load sharing control circuit according to claim 10, wherein the load sharing control circuit is connected to the CC-CV circuit when the load comprises a battery.

\* \* \* \* \*